(12) United States Patent
Peters et al.

(10) Patent No.: US 7,947,965 B2
(45) Date of Patent: May 24, 2011

(54) ION SOURCE FOR GENERATING NEGATIVELY CHARGED IONS

(75) Inventors: Jens Peters, Hamburg (DE); Hans-Hinrich Sahling, Steinkirchen (DE); Ingo Hansen, Hamburg (DE)

(73) Assignee: Deutsches Elektronen-Synchrotron Desy (DE)

( * ) Notice: Subject to any disclaimer, the term of this patent is extended or adjusted under 35 U.S.C. 154(b) by 179 days.

(21) Appl. No.: 12/374,789

(22) PCT Filed: Jul. 26, 2007

(86) PCT No.: PCT/EP2007/006645
§ 371 (c)(1),
(2), (4) Date: Jun. 8, 2009

(87) PCT Pub. No.: WO2008/012094
PCT Pub. Date: Jan. 31, 2008

(65) Prior Publication Data
US 2009/0314952 A1     Dec. 24, 2009

(30) Foreign Application Priority Data

Jul. 28, 2006 (DE) .................. 10 2006 034 988

(51) Int. Cl.
*H01J 27/00* (2006.01)
*H01J 49/12* (2006.01)
(52) U.S. Cl. ............ 250/423 R; 250/423 P; 250/423 F; 250/424; 250/492.21; 250/492.3
(58) Field of Classification Search ............ 250/423 R, 250/423 P, 423 F, 424, 425, 492.21, 492.3
See application file for complete search history.

(56) References Cited

U.S. PATENT DOCUMENTS

| 3,935,451 | A | * | 1/1976 | Janes ............................ 250/283 |
| 5,051,600 | A | * | 9/1991 | Schuetz et al. ............. 250/492.3 |
| 5,838,002 | A | | 11/1998 | Sheehan |

(Continued)

OTHER PUBLICATIONS

International Search Report and Written Opinion from corresponding PCT Application No. PCT/EP2007/006645 (dated Mar. 23, 2009).

(Continued)

*Primary Examiner* — David A Vanore
(74) *Attorney, Agent, or Firm* — Hovey Williams LLP

(57) ABSTRACT

An ion source for generating negatively charged ions is presented and described, said ion source having a closure plate which is provided with an outlet opening and which has a wall which surrounds a combustion chamber, wherein the wall has a tubular section, which extends from the outlet opening and is formed from an insulating material, and has a rear wall, wherein the rear wall is arranged at the end of the tubular section which lies opposite the outlet opening and closes off the combustion chamber, having a coupling coil whose windings are arranged around the tubular section of the wall outside the combustion chamber, and having a filter field magnet. The problem of making available an ion source for generating negatively charged ions which has an increased yield and is also suitable for generating ions from substances which are only available in a gaseous form is solved by virtue of the fact that the rear wall is formed from an insulating material and has an inlet opening, and in that the filter field magnet is arranged on that side of the tubular section which faces away from the combustion chamber.

21 Claims, 5 Drawing Sheets

U.S. PATENT DOCUMENTS

Figure 1:
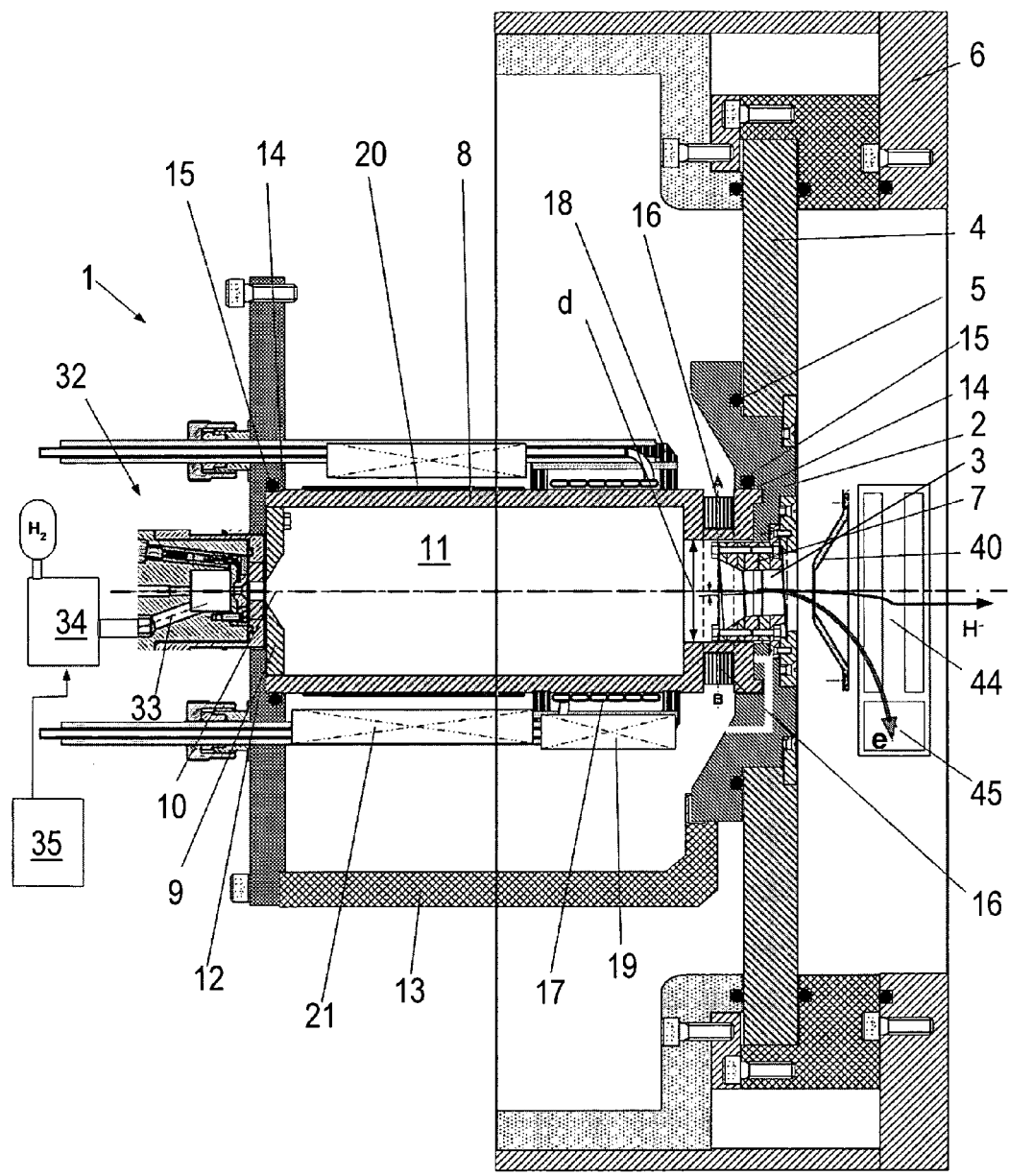

| | | | | |
|---|---|---|---|---|
| 6,031,239 | A  * | 2/2000  | Shi et al. ................... | 250/492.21 |
| 6,319,369 | B1 * | 11/2001 | Flynn et al. ............... | 204/192.38 |
| 6,435,131 | B1   | 8/2002  | Koizumi | |
| 6,765,216 | B2 * | 7/2004  | Kagadei et al. ........... | 250/423 R |
| 7,611,787 | B2 * | 11/2009 | Yang et al. .................... | 429/483 |
| 7,737,397 | B2 * | 6/2010  | Morrisroe ..................... | 250/288 |
| 7,742,167 | B2 * | 6/2010  | Morrisroe ..................... | 356/316 |
| 2004/0104683 | A1 | 6/2004 | Leung et al. | |

OTHER PUBLICATIONS

Moehs, Douglas P., Peters, Jens, and Sherman, Joseph, "Negative Hydrogen Ion Sources for Accelerators," IEEE Transactions on Plasma Science, vol. 33 No. 6, pp. 1786-1798 (Dec. 2005).

Peters, J., "New Developments in rf-driven Multicusp H-ion Sources," Review of Scientific Instruments 77 (2006).

* cited by examiner

ION SOURCE FOR GENERATING NEGATIVELY CHARGED IONS

CROSS-REFERENCE TO RELATED APPLICATION

This is a National Phase Application pursuant to 37 C.F.R. §371 of International Application No. PCT/EP2007/006645, filed Jul. 26, 2007, claiming priority from German Application No. DE 10 2006 034 988.1, filed Jul. 28, 2006, the entire disclosures of both of which are hereby incorporated by reference herein.

BACKGROUND OF THE INVENTION

1. Field of the Invention

The present invention relates to an ion source for generating negatively charged ions, comprising a closure plate, with an outlet opening provided therein, a wall surrounding a combustion chamber, wherein the wall has a tubular section, which extends from the outlet opening and is formed from an insulator material, and a rear wall, wherein the rear wall is arranged at that end of the tubular section which lies opposite the outlet opening, and closes off the combustion chamber, a coupling coil, the windings of which are arranged around the tubular section of the wall outside the combustion chamber, and a filter field magnet, arranged adjacent to the outlet opening, wherein the filter field magnet is configured in such a way that the field lines of the filter field magnet run transversely with respect to the extension direction of the tubular section.

2. Discussion of the Prior Art

Ion sources are generally employed whenever atoms are intended to be accelerated with the aid of electromagnetic fields. This is the case firstly in accelerator installations for scientific purposes, where high-energy ions are caused to collide with one another or with stationary targets in the field of nuclear and particle physics.

Secondly, in the field of semiconductor technology, materials are doped, that is to say impurity atoms are introduced into them, in such a way that the desired species of atoms is "implanted" into the material in the required amount. For this purpose, the corresponding atoms are shot into the material by means of an accelerator. This is associated with the advantage that the defined energy of the atoms can also be used to define the depth to which the atoms penetrate into the material.

In any case, it is necessary, however, for the atoms outwardly to be charged rather than neutral, in order that an electromagnetic field can exert an accelerating force on the atoms. It is necessary, therefore, for the atoms that are to be accelerated to be ionized, and thus for the electron shell not to contain the number of electrons which corresponds to the atomic number of the respective atom. Rather, the number of electrons must deviate from this in order that the charge of the atomic nucleus and that of the electron shell do not mutually compensate for one another.

In the simplest form of ionization, some of the electrons of the shell are removed from the respective atoms by a plasma in an ion source, such that the residual ions are then positively charged and can be extracted by a simultaneously applied electric field.

In specific accelerator installations, so-called tandem accelerators, in which the center of an acceleration path is at positive potential, it is necessary, however, firstly to generate negatively charged ions, which are then accelerated by the potential to the center of the acceleration path in order to be "stripped" there, that is to say to lose some of the electrons, and thus to be subjected to charge reversal from negative to positive ions. The potential, which now has the effect of repelling the ions, accelerates the latter again. In this case, the principle of the tandem accelerator is associated with the advantage that the acceleration potential is multiply utilized.

This means that it is necessary in this case to ensure in the ion source that the atoms have at least one electron more in their shell than is the case in the normal state. With regard to the ion source in tandem accelerators it should furthermore be taken into account that such an accelerator installation is generally set in such a way that only those ions which have a specific charge state are led further to the target after the acceleration process. However, the charge reversal is a statistical process and not all of the ions injected into the accelerator have the desired charge state after the charge reversal, rather a distribution arises which is dependent on the parameters during stripping.

This in turn has the effect that a considerable loss of beam current occurs as a result of the charge reversal, such that it is necessary to inject a very high beam current of negatively charged ions into the tandem accelerator in order consequently to obtain a sufficiently high current of positive ions having the desired charge state. This in turn presupposes that the ion source disposed upstream of the accelerator for generating negatively charged ions supplies a highest possible yield.

U.S. 2004/0104683, from which the present invention proceeds, discloses for this purpose an ion source comprising a closure plate with an outlet opening provided therein, and comprising a wall surrounding a combustion chamber, wherein the wall has a tubular section, which extends from the outlet opening and is formed from an insulator material, and a rear wall. The rear wall is arranged at that end of the tubular section which lies opposite the outlet opening, wherein the rear wall closes off the combustion chamber. In addition, a coupling coil is provided, the windings of which are arranged around the tubular section of the wall outside the combustion chamber in order to couple a radio-frequency field into the combustion chamber. Finally, a filter field magnet is provided, which is arranged adjacent to the outlet opening and serves to prevent energetic electrons from the plasma from leaving the combustion chamber through the outlet opening. Low-energy electrons can diffuse through the field, however, wherein the filter field magnet is configured in such a way that the field lines of the filter field magnet run transversely with respect to the extension direction of the tubular section. What is disadvantageous about an ion source of this type, however, is that the yield of negative ions is insufficient.

A further problem of this source is that the filter field magnet is arranged within the closure plate adjacent to the outlet opening and is thus exposed to the plasma. This can have the effect that the magnet incurs damage during operation of the source and the source has to be serviced after a short operating time. Moreover, said magnet influences the potential of the plasma in the outlet region by drawing electrons from the plasma.

Proceeding from the prior art, the object, therefore, is to provide an ion source for generating negatively charged ions which supplies an increased yield and is suitable for generating ions even from substances available only in gaseous form.

SUMMARY

According to the invention, this object is achieved by virtue of the fact that the rear wall is formed from an insulator material and has an inlet opening for gas, and that the filter field magnet is arranged on that side of the tubular section which is remote from the combustion chamber.

What is achieved by the construction according to the invention is that plasma formed within the combustion chamber by the radio-frequency field radiated in, in contrast to the prior art, comes into contact essentially only with parts which are formed from an insulator material. This has the advantage that the particle loss of the plasma is smaller. It is therefore possible to work with a lower radio-frequency power.

As a result of the insulation of the plasma, the latter becomes potential-free. There is therefore the possibility of freely arranging electrodes for example in the region of the outlet opening or the inlet opening and, by way of their potential, manipulating the plasma potential and thus the particle currents and concentrations. Aluminum oxide ceramic ($Al_2O_3$) can preferably be used as insulation material since it has a particularly low sputtering rate. Operation for years is thereby possible.

A further advantage of this arrangement is that the filter magnet is arranged completely outside the combustion chamber and therefore no longer has any contact with the plasma. This prevents the magnet from being able to incur damage during operation. It no longer need be specially encapsulated, nor is it exposed to the temporary vacuum.

On the other hand, the filter field magnet is arranged in such a way that it can act effectively on the plasma. It shields the region of the outlet opening from energetic electrons by a low diffusion rate and permits the low-energy electrons necessary for H generation to pass through.

Since the filter field magnet is arranged on that side of the tubular section which is remote from the combustion chamber, and thus at a distance from the outlet opening, it no longer influences the potential at the outlet opening and does not dissipate any electron current.

Overall, therefore, in conjunction with a high yield of negatively charged ions, the resulting requirement for maintenance work is low and the source can also be used for ionizing gaseous substances such as hydrogen, for example, since the latter can be admitted into the combustion chamber via the inlet opening in the rear wall.

In one preferred embodiment of the ion source according to the invention, the diameter of the outlet opening is greater than or equal to the diameter of the opening of the tubular section which faces the outlet plate. Furthermore, a collar element having a through hole is provided in the outlet opening.

The collar element serves firstly to bring about the generation of negatively charged ions, wherein this process can proceed as follows in the case of hydrogen. From the plasma, excited hydrogen molecules ($H^*_2$) pass into the region of the collar element. It additionally happens here that the hydrogen molecule is split up, a low-energy electron is taken up and a neutral hydrogen atom and a negative hydrogen atom remain. Accordingly, the process proceeds in accordance with the equation $H_2^* + e^- \rightarrow H^0 + H^-$.

Secondly, the collar element serves to ensure that fewer electrons are extracted from the combustion chamber. In a manner exhibiting further preference, therefore the collar element has a plurality of electrodes which are arranged one behind another as seen in the axial direction of the outlet opening and which can typically be embodied as ring segments and are insulated from one another, wherein the electrodes can be put at electrical potentials deviating from one another. In this way, in the region of the collar element it is possible to generate an electric field that has the effect that electrons from the plasma can pass through the collar element and hence the outlet opening with only a low probability. In contrast thereto, the negative hydrogen ions, on account of their higher mass, are nevertheless able to pass through the outlet opening.

Furthermore, at the first half-rings, positive ions ($H^+$) are converted to neutral but excited molecules ($H_2^*$), which together with slow electrons likewise form $H^0$ (neutral hydrogen atoms) and $H^-$ ions.

In order to further intensify the filter effect with regard to the electrons and the efficiency during charge reversal, it is particularly preferred for the internal diameter of the through hole of the collar element to decrease with increasing distance from the combustion chamber.

The funnel-shaped part that arises in this way can be regarded as a particle converter, at the surface of which $H^+$ ions are converted into $H_2^*$ molecules as a result of the supply of electrons. $H^-$ ions then arise from said molecules in the manner already described. In addition, however, a direct conversion of $H^+$ ions into $H^-$ ions is also possible, in which case this proceeds in accordance with the equation $H^+ + 2e^- \rightarrow H^-$.

Furthermore, it is possible for the collar element to be divided along a plane running in the direction of the longitudinal axis of the through hole, wherein, in a manner exhibiting further preference, the separating plane runs parallel to the field lines of the filter field magnet, such that the collar element has a first, left-hand half-shell and a second, right-hand half-shell, and the half-shells are insulated from one another. As a result, an electric field running transversely both with respect to the direction of the hole and with respect to the direction of the magnetic field can be generated in the region of the collar element, which increases the deflection of the electrons and makes it impossible for a relatively large proportion of electrons to pass the collar element.

In order to achieve a good concentration of the beam of negative ions from the source, in one preferred embodiment a plasma diaphragm having a hole can be provided in the outlet opening, wherein the diameter of the hole is less than the diameter of the through hole of the collar element.

Finally, it has proved to be advantageous if the longitudinal axis of the through hole of the collar element is inclined with respect to the longitudinal axis of the tubular section. This takes account of the deflection of the particles by the magnetic field of the filter field magnet. The heavy H ions, which are not deflected very much, can pass, while the greatly deflected electrons hit the walls of the collar element.

Furthermore, it is preferred if the tubular section is held between the closure plate and a holding plate, the closure plate and the holding plate have bearing surfaces which run parallel to the longitudinal axis of the tubular section and which run around the outer circumference of the tubular section, and circumferential seals are provided between the bearing surfaces and the tubular section.

In the case of a construction of this type, the tubular section formed from insulation material is held in such a way that although the combustion chamber is sealed from the surroundings, the tubular section can nevertheless expand in the direction of its extension direction. This prevents the occurrence of stresses in the material of the tubular section on account of the high temperatures, which stresses could lead to cracks in the section. Moreover, the seals are arranged in such a way that they can be cooled by the radially outer closure wall or holding plate. The seals can on the one hand be embodied as conventional rubber seals. It is on the other hand also conceivable, however, for metal seals to be used, which are fixed to the outer surface of the tubular section in such a way that firstly a metal layer is applied to the tubular section and a metallic seal element is fixed thereto.

In order to increase the efficiency with which the radio-frequency field is coupled into the combustion chamber, it has furthermore proved to be advantageous if the coupling coil has windings having a flattened cross section.

In a further preferred embodiment, the ion source according to the invention has an electrode on the outwardly facing side of the tubular section in the region between the coupling coil and the rear wall. This has the effect that an electric field is formed between the coupling coil and the electrode, which electric field in turn has the effect that the plasma is heated further.

Finally, the coupling coil can be surrounded by a ferrite sleeve on the side remote from the tubular section, in order to ensure that the radio-frequency field is predominantly radiated into the combustion chamber and not emitted into the surroundings.

In a further preferred embodiment, the radio-frequency coupling coil is surrounded by a plurality of first magnets which run in the axial direction of the tubular section and are arranged parallel to one another around the circumference of the tubular section. Furthermore, the dipole axes, that is to say the connecting lines between the North Pole and the South Pole in the case of a permanent magnet, of the first magnets are oriented perpendicular to the longitudinal axis of the tubular section, and adjacent first magnets have a mutually opposite polarity. By means of the first magnets, a magnetic field is formed whose field lines run perpendicular to the longitudinal axis of the tubular section and the plasma can be constricted in the combustion chamber. As a result, it begins only at a certain distance from the wall of the tubular section.

In addition, the region of the tubular section between the coupling coil and the rear wall is surrounded by a plurality of second magnets which run in the axial direction of the tubular section and are arranged perpendicular to one another around the circumference of the tubular section, wherein the dipole axes of the second magnets are likewise oriented perpendicular to the longitudinal axis of the tubular section, and wherein adjacent second magnets have a mutually opposite polarity.

In this case, it is particularly preferred if the number of second magnets around the circumference of the tubular section is smaller adjacent to the rear wall than adjacent to the coupling coil. As a result, the plasma compressed to the central region of the combustion chamber by the first magnets is kept away from the rear wall.

In a particularly preferred embodiment, an ignition source having a gas inlet is provided, wherein the ignition source has a housing surrounding an ignition chamber and having an end face lying opposite the rear wall. Furthermore, the ignition chamber is connected to the combustion chamber via the inlet opening and the end face has an ignition electrode having a hole. The ignition electrode is covered relative to the ignition chamber by a covering plate and is insulated from the rear wall. The ignition source serves to generate electrons which are shot through the inlet opening into the combustion chamber in order to ignite a plasma there, wherein use is made of the fact that a higher pressure is present in the ignition source than in the combustion chamber. As a result, a plasma can easily be generated by applying a voltage to the ignition electrode in the ignition source, wherein the electrons can then be injected into the combustion chamber and reliably ignite the necessary plasma there.

Furthermore, the gas inlet of the ignition source can preferably have an inlet valve with a controller, and the controller can be configured to provide an opening and closing of the inlet valve and/or a different through-flow through the inlet valve as a function of time. This makes it possible to alter the pressure relations in the ignition source automatically in a time-dependent manner.

In order to be able to better control the pressure relations in the combustion chamber, it is advantageous to have an additional possibility of introducing gas into the combustion chamber without for example influencing the state in the ignition source. For this purpose, it is preferred if the front closure plate has an inlet for gas and the inlet leads through the closure plate into the combustion chamber.

Finally, in one preferred embodiment, an extractor is provided on that side of the closure plate which is remote from the combustion chamber, wherein the extractor has a passage opening oriented with respect to the outlet opening. An acceleration voltage can be applied between the extractor and the closure plate, and a magnetic spectrometer is provided behind the extractor as seen from the closure plate. Furthermore, an electron collector is provided, which is arranged adjacent to the magnetic spectrometer, and the electron collector is configured such that an electrical voltage can be applied.

The fact that the electron collector can be put at an increased potential avoids the problem that a high electron current from the ion source into the collector can have the effect of destabilizing the extraction voltage present between the extractor and closure plate. If electrons and H ions are extracted from the outlet opening, the two types of particles do not encounter the extractor during normal operation. While the closure plate is operated at a negative high voltage, the extractor is at ground. The electron collector is in turn at a negative potential, which is somewhat lower than that of the closure plate. A retarding field thus builds up at the electron collector with respect to the electron beam deflected by the magnetic field. Therefore, the beam deposits only a low energy in the electron collector, which as a result heats up only slightly. The cooling which is therefore no longer required and the reduced loading of the collector are already a considerable advantage.

A further advantage is that the electrons are taken up by a power supply unit with a lower voltage. It is thereby possible to use cost-effective capacitors that can be very large. Such a power supply unit is smaller and does not endanger the extractor and the source. No flashovers occur either, since the distances are very large. The actual power supply unit that generates the high voltage for the source is loaded only by the low H ion current. The capacitance of the capacitor can therefore be lower, which is important since then in the event of flashovers in the extractor and source region less energy is deposited from the capacitor into the short circuit, which is a further advantage of this arrangement.

Finally, the closure plate can preferably be fitted at its circumference to a fixing plate formed from an insulator material, such that the distances with respect to the housing can be smaller in comparison with a plastic mount. Overall a smaller structural size in conjunction with high operational reliability is thus possible.

BRIEF DESCRIPTION OF THE DRAWING FIGURES

Figure 2:
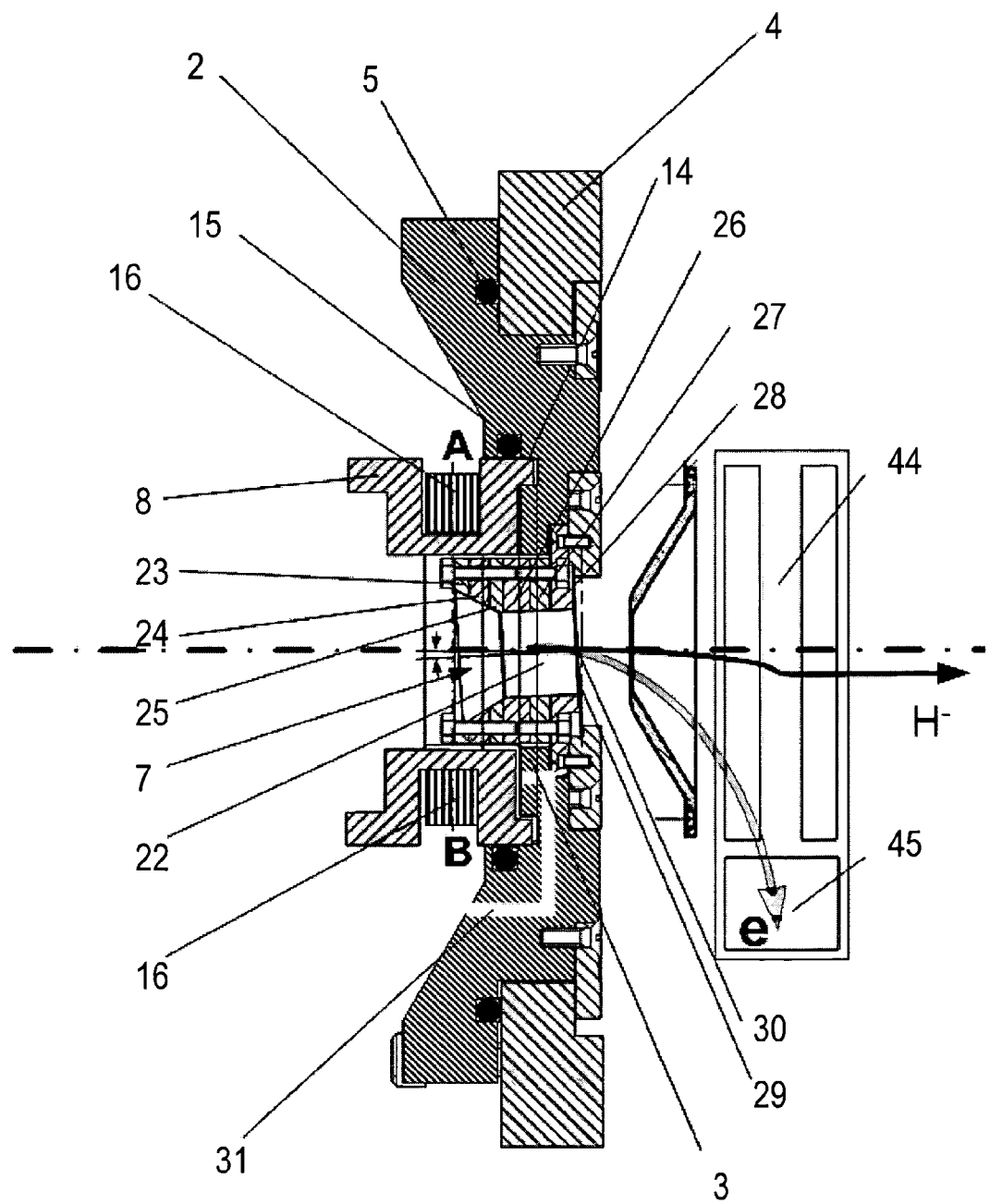
Figure 3:
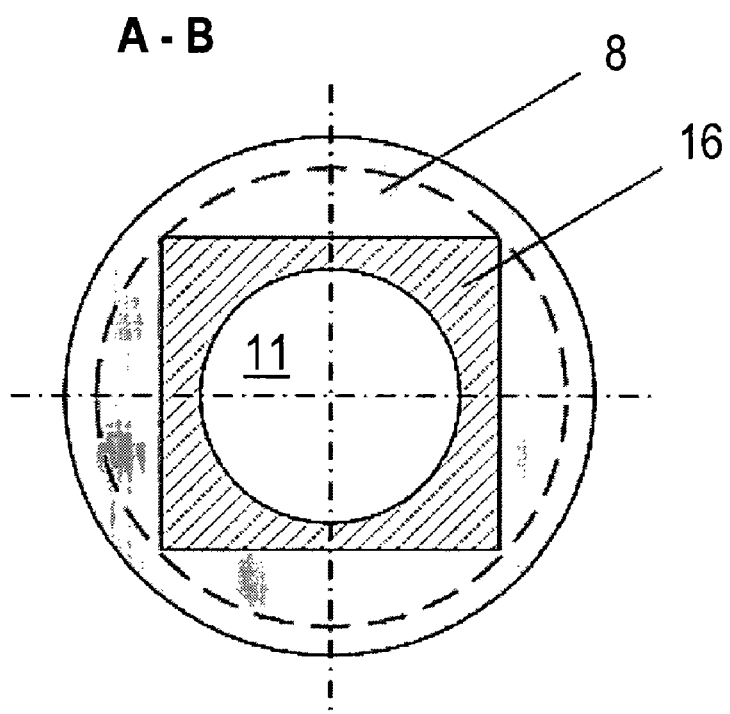
Figure 4:
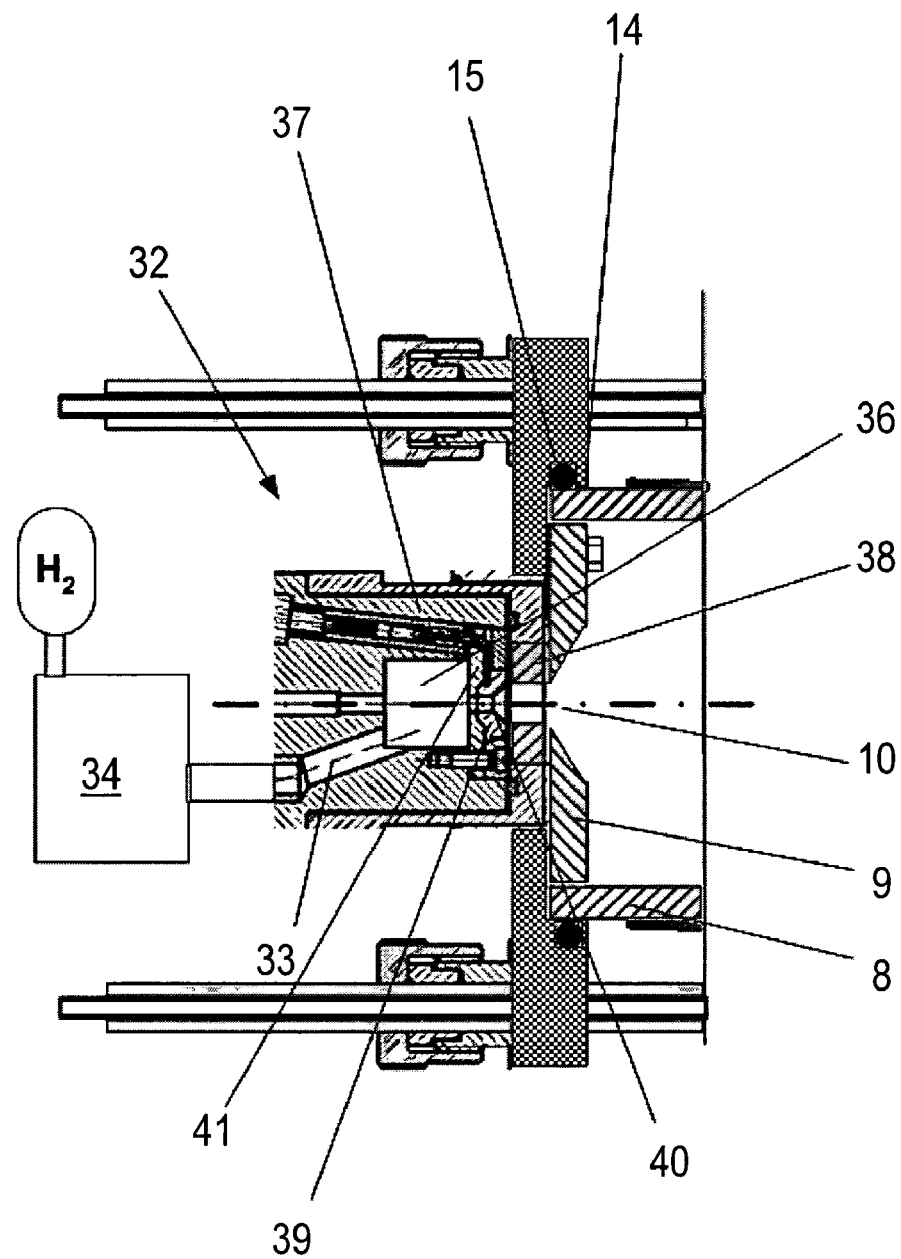
Figure 5:
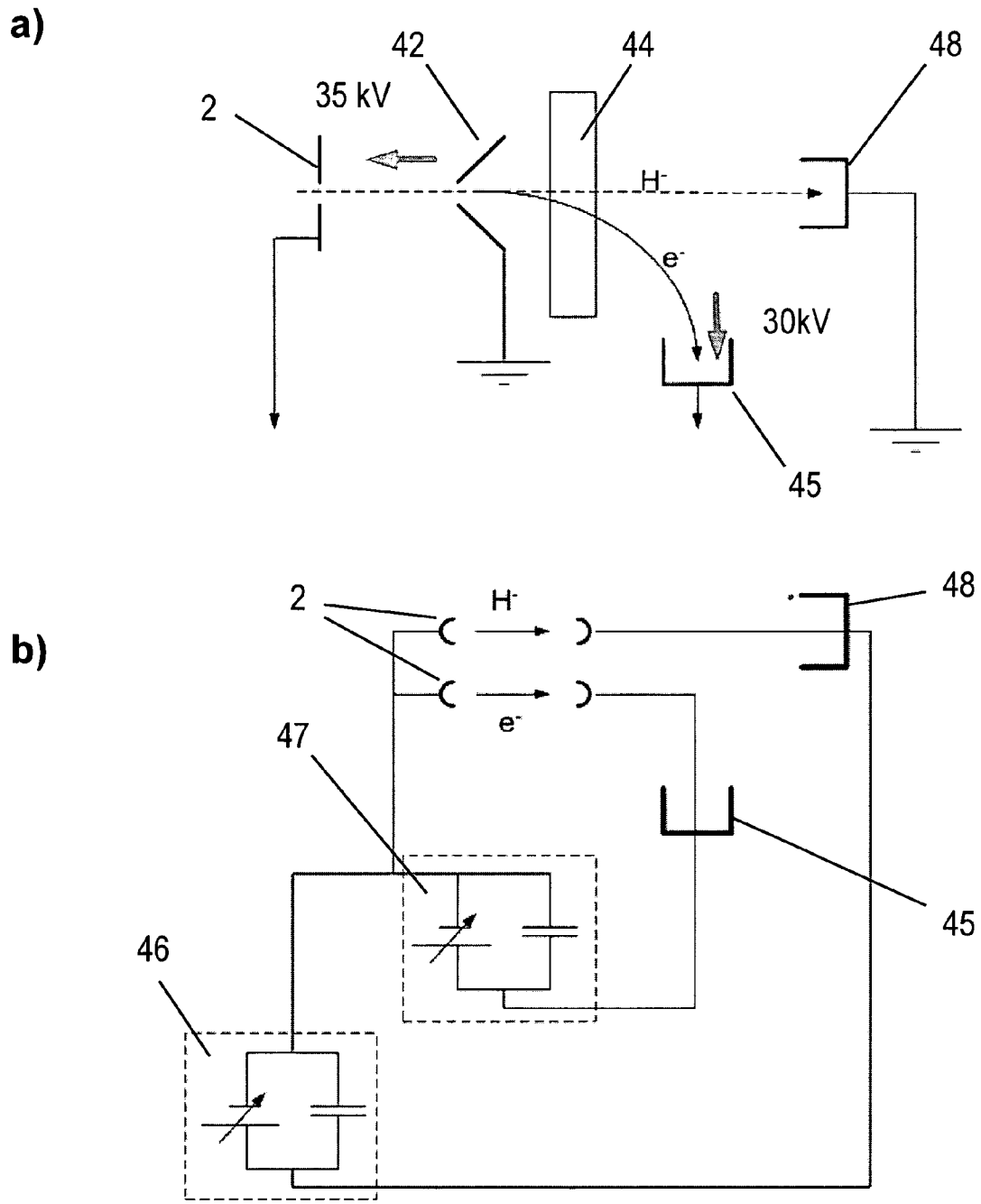

The present invention is explained below with reference to a drawing, which illustrates only a preferred exemplary embodiment, wherein FIG. 1 shows a section along the longitudinal axis of an embodiment of an ion source according to the invention, FIG. 2 is an enlarged illustration of the front extraction part of the ion source from FIG. 1, FIG. 3 is a section along the line A-B from FIGS. 1 and 2, FIG. 4 is an enlarged illustration of the rear part of the ion source from FIG. 1, and FIGS. 5a and 5b are circuit diagrams with respect to the ion source according to the invention.

DETAILED DESCRIPTION OF THE PREFERRED EMBODIMENTS

FIG. 1 shows an embodiment of an ion source 1 according to the invention in longitudinal section, wherein the ion source 1 has a closure plate 2 provided with a central outlet opening 3. The closure plate 2 is fitted to a fixing plate 4 produced from an insulator material such as, for example, a ceramic, in particular aluminum oxide ceramic ($Al_2O_3$). The fixing plate 4 is constructed in a ceramic-appropriate manner, that is to say simply and without a multiplicity of holes, grooves, etc. It is thereby possible to fully utilize the advantage of this material over plastic, which rapidly becomes unusable owing to the formation of carbon tracks after flashovers. It is thus possible for the distances with respect to the housing to be chosen to be smaller in comparison with plastic, such that overall a smaller structural size in conjunction with high operational reliability becomes possible.

A seal 5 is provided between the fixing plate 4 and the closure plate 2 and the fixing plate 4 is in turn fitted to an end plate 6, from which issues the beam tube of an accelerator installation. The ion source 1 is electrically insulated from the end of the beam tube by the insulating fixing plate 4.

A collar element 7 is provided in the outlet opening 3, the construction of which collar element will be explained in detail later in conjunction with FIG. 2. There extends from the outlet opening 3 in the closure plate 2 a tubular section 8, at whose end lying opposite the outlet opening 3 a rear wall 9 is provided, said rear wall having an inlet opening 10. Both the tubular section 8 and the rear wall 9 are formed from an insulator material. In this case, the tubular section 8 and the rear wall 9 together form the wall of a combustion chamber 11, wherein a plasma in the combustion chamber 11 does not come into contact with electrically conductive material, with the exception of the collar element 7.

Furthermore, the outlet opening 3 has a diameter which, in this exemplary embodiment that is preferred to this extent, is equal to the diameter d of the opening of the tubular section 8 that faces the closure plate 2. That end of the combustion chamber 11 which faces the closure plate 2 is thus formed completely by the collar element 7.

Moreover, the tubular section 8 is held between the closure plate 2 and a holding plate 12, wherein the holding plate 12 likewise holds the rear wall 9 and is tensioned against the closure plate 2 by means of tensioning struts 13. In order that the tubular section 8 is not under mechanical stress even in the event of thermal expansion on account of high temperatures in the combustion chamber 11, the closure plate 2 and the holding plate 12 have bearing surfaces 14 which run parallel to the longitudinal axis of the tubular section 8 and which run around the outer circumference of the tubular section 8 and in which in turn grooves are formed for receiving circumferential sealing rings 15 (also see FIGS. 2 and 4). As a result of this arrangement, although the combustion chamber 11 is sealed from the surroundings by means of the sealing rings 15, it is nevertheless possible that the tubular section 8 can expand along its longitudinal axis without this influencing the effect of the sealing rings 15. The sealing rings 15 can on the one hand be embodied as conventional rubber seals, as illustrated. It is on the other hand also conceivable, however, for metal seals to be used, the latter being fixed to the outer surface of the tubular section 8 in such a way that firstly a metal layer is applied to the tubular section 8 in the region of the bearing surfaces 14 and a metallic sealing element is fixed thereto.

On that side of the tubular section 8 which is remote from the combustion chamber 11, a filter field magnet 16 is provided adjacent to the outlet opening 3, said filter field magnet, in this preferred embodiment, being constructed from two permanent magnets lying opposite one another (see FIG. 3). However, it is also conceivable for an electromagnet to be used instead of permanent magnets. The filter field magnet 16 is configured in such a way that the field lines of the filter magnet 16 run transversely with respect to the extension direction of the tubular section 8, such that energetic electrons are prevented from leaving the combustion chamber 11 through the collar element 7 (see FIG. 3).

Since the filter field magnet 16 is arranged outside the combustion chamber 11, it cannot have any contact with the plasma therein and cannot be damaged. Moreover, it no longer influences the potential at the outlet opening 3 and does not dissipate any electron current.

Furthermore, a coupling coil 17 is provided, the windings of which are arranged around the tubular section 8 of the wall outside the combustion chamber 11. In this case, the windings of the coupling coil 17 are provided with a flattened cross section, which increases the efficiency with which a radio-frequency field can be coupled into the combustion chamber 11. The coupling coil 17 is additionally surrounded by ferrite elements that form a ferrite sleeve 18, which ensures that the radio-frequency field is to a large extent radiated into the combustion chamber 11 and is not emitted into the surroundings, in order thus to minimize the losses.

Moreover, the coupling coil 17 is surrounded by a plurality of first magnets 19 which run in the axial direction of the tubular section 8 and are arranged parallel to one another around the circumference of the tubular section 8. In addition, the dipole axes, that is to say the connecting lines between North Pole and South Pole, of the first magnets 19 are oriented perpendicular to the longitudinal axis of the tubular section 8, and adjacent first magnets 19 have a mutually opposite polarity. What is thereby achieved is that around the circumference of the tubular section magnetic North Poles and magnetic South Poles are in each case adjacent to one another. As a result, the field lines in the combustion chamber 11 run approximately parabolically in the plane perpendicular to the extension direction of the tubular section 8.

Furthermore, the embodiment of an ion source 1 according to the invention has an electrode 20 on the outwardly facing side of the tubular section 8 in the region between the coupling coil 17 and the rear wall 9. Said electrode 20 has the effect that an electric field is formed between the coupling coil 17 and the electrode 20 if a radio-frequency is applied to the coupling coil 17. Said electric field in turn has the effect that a plasma in the combustion chamber 11 can heat up further.

Moreover, the region of the tubular section 8 between the coupling coil 17 and the rear wall 9 is surrounded by a plurality of second magnets 21 which run in the axial direction of the tubular section 8 and are arranged perpendicular to one another around the circumference of the tubular section 8. Furthermore, the dipole axes of the second magnets 21 are likewise oriented perpendicular to the longitudinal axis of the tubular section 8 and adjacent second magnets 21 have a mutually opposite polarity. Such a construction, as in the case of the first magnets 19, leads to a parabolic field profile in the plane perpendicular to the extension direction of the tubular section 8, such that a plasma in the combustion chamber 11 is compressed to the region around the center axis.

The first and the second magnets 19 and 21 and the coupling coil 17 can be embodied in coolable fashion.

In order to ensure that a plasma in the combustion chamber 11 is at a distance from the rear wall 9, in this respect preferred embodiment the number of second magnets 21 adjacent to the rear wall 9 around the circumference of the tubular section 8 is less than the number adjacent to the coupling coil 17.

FIG. 2 illustrates in particular the closure plate 2 with the collar element 7, which is arranged in the outlet opening 3 and has a through hole 22, wherein the longitudinal axis of the through hole 22 is inclined with respect to the longitudinal axis of the tubular section 8. The collar element 7 has a plurality of electrodes 23, 24, 25, 26, 27, 28, which are arranged one behind another as seen in the axial direction of the outlet opening 3 and which are embodied in ring-shaped fashion and are insulated from one another, such that the electrodes 23, 24, 25, 26, 27, 28 can be put at electrical potentials that deviate from one another. The electrodes 23, 24, 25, 26, 27, 28 have different tasks during the operation of the ion source, which tasks will be explained later. In particular, the electrodes 23, 24, 25, 26, 27, 28 are configured in such a way that the internal diameter of the through hole 22 of the collar element 7 decreases with increasing distance from the combustion chamber 11.

Moreover, in this preferred embodiment, the collar element 7 and thus the electrodes 23, 24, 25, 26, 27, 28 are divided along a separating plane running in the direction of the longitudinal axis of the through hole 22 and parallel to the field lines of the filter field magnet 16, such that it has a first, left-hand half-shell and a second, right-hand half-shell, which are insulated from one another, moreover. As a result, it is possible to apply an electric field between one half-shell and the other half-shell, which electric field runs transversely with respect to the through hole 22 and the magnetic field of the filter field magnet.

For focusing the beam of ions emerging from the ion source 1, a plasma diaphragm 29 having a hole 30 is provided in the outlet opening 3. In this case, the plasma diaphragm 29 is arranged on that side of the collar element 7 which is remote from the combustion chamber 11, and the diameter of the hole 30 is than the diameter of the through hole 22.

FIG. 2 furthermore shows that the closure plate 2 has an inlet 31 for gas, which inlet leads through the closure plate 2 into the combustion chamber. Gas can thus be introduced into the combustion chamber 11 through the front inlet 31 in addition to the inlet opening 10.

As shown in FIG. 4, the ion source 1 in this embodiment that is preferred to this extent additionally has an ignition source 32 having a gas inlet 33, wherein the gas inlet 33 has an inlet valve 34 connected to a controller 35 (see FIG. 1). The controller 35 is configured to enable an opening and closing of the inlet valve 34 and/or a different through-flow through the inlet valve 34 as a function of time, such that gas can be introduced into the ignition source 32 in pulsed and/or temporally modulated fashion.

The ignition source 32 comprises a housing 37 surrounding an ignition chamber 36 and having an end face 38 lying opposite the rear wall 9, wherein the ignition chamber 36 is connected to the combustion chamber 11 via the inlet opening 10. The end face 38 is provided with an ignition electrode 39 having a hole 40, and the ignition electrode 39 is covered relative to the ignition chamber 36 by a covering plate 41. Since the end face 38 is formed from an insulator material, the ignition electrode 39 is insulated from the rear wall 9. The method of operation of the ignition source 32 will be explained in greater detail below.

In the preferred embodiment illustrated, the ion source 1 has, on that side of the closure plate 2 which is remote from the combustion chamber 11, an extractor 42 having a passage opening 43, said extractor being aligned with the outlet opening 3 and the through hole 22. An acceleration voltage can be applied between the extractor 42 and the closure plate 2 in order to accelerate the ions from the combustion chamber 11 in the direction of the extractor 42. In this case, the procedure is such that the extractor 42 is at ground potential, while the closure plate 2 and the combustion chamber 11 are put at an increased potential of for example −35 kV (see FIG. 5*a*). This is readily possible since the closure plate 2 is insulated from the beam tube.

A magnetic spectrometer 44 is provided behind the extractor 40 as seen from the point of view of the closure plate 2, said magnetic spectrometer serving to deflect electrons extracted by the acceleration voltage, wherein said electrons are collected by an electron collector 45 arranged adjacent to the magnetic spectrometer 44. In this case, the electron collector 45 is configured such that an electrical voltage can be applied, which reduces the potential difference between closure plate 2 and electron collector 45, wherein the construction is explained below with reference to FIGS. 5*a* and 5*b*.

Firstly, a first power supply unit 46 is provided, by means of which a high voltage (−35 kV) is applied between the extractor 42, which is at ground potential, and the closure plate 2. Secondly, a second power supply unit 47 is connected between the closure plate 2, on the one hand, and the electron collector 45, on the other hand, such that the electron collector 45 is at +5 kV with respect to the closure plate 2, such that the energy that an electron deposits in the electron collector is approximately 5 keV and thus comparatively low.

The ion source 1 according to the invention is operated in the following manner. Firstly, the gas from which negatively charged ions are intended to be obtained is introduced into the ion source 1 via the gas inlet 33. In this case, the inlet valve 34 can be driven in a time-dependent manner by means of the controller 35, such that the gas enters into the ignition source 32 in a pulsed manner, for example. In the ignition source 32, firstly electrons are generated by a high voltage of approximately 1 kV being applied to the ignition electrode 39, such that a plasma is formed in the ignition chamber 36. Electrons from the ignition chamber 36 pass via the hole 40 and the inlet opening 10 into the combustion chamber 11 and serve to ignite the actual plasma in the combustion chamber 11. In this case, the gas in the combustion chamber 11 is heated by means of the radio-frequency field radiated in. This exploits the fact that on account of the small cross section of the inlet opening 10 and of the hole 40 in the ignition chamber 36 a higher pressure is present than is desired for the actual plasma in the combustion chamber 11. This higher pressure enables an electrode ignition from the plasma that is thus generated, and it is possible to obtain the required electrons.

In order to generate the plasma in the combustion chamber 11, gas is introduced into the combustion chamber 11 firstly via the ignition source 32 and the inlet opening 10 and secondly via the inlet 31. Secondly, a radio-frequency field is radiated in the combustion chamber 11 via the coupling coil 17, wherein the flattened cross section of the turns yields a high efficiency. In the combustion chamber 11, an electric field additionally builds up between the coupling coil 17 and the electrode 20, which electric field has the effect that the plasma heats up. The arrangement of the first and second magnets 19 and 21 leads to the plasma being concentrated on the central region of the combustion chamber 11.

Moreover, the tubular section 8 formed from an insulator material and the rear wall 9 likewise formed from insulator material prevents the plasma from being "grounded" and particles thus being lost. The latter would have to be additionally generated, which would necessitate additional radio-frequency power. Since the filter field magnet 16 is furthermore arranged outside the combustion chamber 11, it can neither "ground" the plasma nor incur damage from the plasma.

For the case where hydrogen is introduced as gas into the combustion chamber 11, excited hydrogen molecules ($H^*_2$) pass from the plasma into the region of the collar element 7. It happens here that the hydrogen molecule is split up, a filtered, slow electron is taken up and a neutral hydrogen atom and a negative hydrogen ion remain, such that the process proceeds in accordance with the equation $H_2^* + e^- \rightarrow H^0 + H^-$.

Electrical potentials deviating from one another are applied to the electrodes 23, 24, 25, 26, 27, 28 of the collar element 7, wherein a voltage is also applied between the half-shells on account of the division of the electrodes 23, 24, 25, 26, 27, 28 along the plane in the direction of the longitudinal axis. In this way, an electric field can be generated in the region of the collar element 7, which electric field has the effect that electrons from the plasma can pass the collar element 7 and thus the outlet opening 3 only with a lower probability. In contrast thereto, the negative hydrogen ions, on account of their higher mass and the associated lower influenceability by fields, are nevertheless able to pass through the outlet opening 3.

Moreover, the charge reversal process is intensified further by the arrangement of the electrodes 23, 24, 25, 26, 27, 28. Specifically, the first rings of electrodes 23, 24, 25 as seen from the direction of the combustion chamber 11 and the potential applied to them serve to convert positive hydrogen ions ($H^+$) into neutral hydrogen molecules ($H_2^*$) from which $H^-$ ions are then formed with slow electrons.

Moreover, the field of the filter field magnet 16 already prevents the passage of energetic electrons from the plasma in the combustion chamber 11 into the region of the collar element 7, where they might otherwise destroy the H ions just formed.

The $H^-$ ions are then extracted from the source by means of the potential difference by means of the first power supply unit 46 between the closure plate 2 and the extractor 42, wherein the plasma diaphragm 29 having the hole 30 serves to focus the beam.

The magnetic spectrometer 44 directs electrons present in the beam into the electron collector 45, wherein the latter, in contrast to the extractor 42 is not at ground potential, but rather at an increased potential on account of the second power supply unit 47 (see FIGS. 5a and 5b). This has the advantage that high electron currents into the electron collector 45 do not impair the stability of the high voltage between extractor 42 and closure plate 2 and the power loss in the electron collector 45 is small and cooling of the electron collector 45 is not necessary.

In particular, the fact that the electron collector 45 can be put at an increased potential avoids the problem that a high electron current from the ion source into the collector 45 can have the effect of destabilizing the extraction voltage (first power supply unit 46) present between the extractor 42 and closure plate 2. If electrons and $H^-$ ions are extracted from the outlet opening 3, the two types of particles do not encounter the extractor 42 during normal operation. While the closure plate 2 is operated at a negative high voltage, the extractor 42 is at ground. The electron collector 45 is in turn at a negative potential, which is somewhat lower than that of the closure plate 2. A retarding field thus builds up at the electron collector 45 with respect to the electron beam deflected by the magnetic field of the magnetic spectrometer 44. Therefore, the beam deposits only a low energy in the electron collector 45, which as a result heats up only slightly. The cooling which is therefore no longer required and the reduced loading of the collector 45 are already a considerable advantage.

Furthermore, the electrons are taken up by the second power supply unit 47 with a lower voltage (see FIG. 5b). It is thereby possible to use cost-effective capacitors in the second power supply unit 47 that can be very large. Such a power supply unit is smaller and does not endanger the extractor 42 and the source. No flashovers occur either, since the distances are very large. The first power supply unit 46, that generates the high voltage for the source, is loaded only by the low H ion current for example to the target 48. The capacitance of the capacitor can therefore be lower, which is important since then in the event of flashovers in the extractor 42 and source region less energy is deposited from the capacitor into the short circuit, which is a further advantage of this arrangement.

Consequently, a high yield of negatively charged ions can be achieved with the ion source 1 according to the invention, wherein there is a low requirement for maintenance work. Moreover, the source can also be used for the ionization of gaseous substances such as hydrogen, for example, which can be admitted into the combustion chamber 11 via the inlet opening 10 in the rear wall.

The invention claimed is:

1. An ion source for generating negatively charged ions, said ion source comprising:
    a closure plate, with an outlet opening provided therein,
    a wall defining a combustion chamber, wherein the wall includes a tubular section that extends from the outlet opening and is formed from an insulator material, and a rear wall,
    said rear wall being disposed at an end of the tubular section opposite the outlet opening and closing off the combustion chamber,
    a coupling coil including windings that are arranged around the tubular section of the wall outside the combustion chamber, and
    a filter field magnet disposed adjacent the outlet opening,
    said filter field magnet being configured such that field lines of the filter field magnet run transversely with respect to an extension direction of the tubular section,
    said rear wall is being formed from an insulator material and including an inlet opening, and
    said filter field magnet being disposed on a side of the tubular section remote from the combustion chamber.

2. The ion source as claimed in claim 1,
    said outlet opening presenting a diameter that is greater than or equal to a diameter of an opening of the tubular section that faces the closure plate, and
    a collar element including a through hole disposed in the outlet opening.

3. The ion source as claimed in claim 2,
    said collar element including a plurality of electrodes disposed one behind another with respect to an axial direction of the outlet opening,
    said plurality of electrodes being insulated from one another.

4. The ion source as claimed in claim 3,
    said plurality of electrodes having electrical potentials that deviate from one another.

5. The ion source as claimed in claim 2, said through hole of the collar element presenting a diameter that decreases as axial distance from the combustion chamber increases.

6. The ion source as claimed in claim 2,
    said collar element being divided along a separating plane extending in the direction of the longitudinal axis of the through hole such that the collar element presents a first half-shell and a second half-shell, and
said half-shells being insulated from one another.

7. The ion source as claimed in claim 6,
said separating plane extending parallel to the field lines of the filter field magnet.

8. The ion source as claimed in claim 2,
further comprising a plasma diaphragm including a hole
said plasma diaphragm being disposed in the outlet opening, and
said hole of the plasma diaphragm presenting a diameter that is less than the diameter of the through hole of the collar element.

9. The ion source as claimed in claim 2,
said longitudinal axis of the through hole of the collar element being inclined with respect to the longitudinal axis of the tubular section.

10. The ion source as claimed in claim 1,
further comprising a holding plate,
said tubular section being disposed between the closure plate and the holding plate
said closure plate and the holding plate each presenting bearing surfaces that extend parallel to the longitudinal axis of the tubular section and that extend around the outer circumference of the tubular section, and
a plurality of circumferential seals disposed between the bearing surfaces and the tubular section.

11. The ion source as claimed in claim 1,
said coupling coil including windings that present a flattened cross section.

12. The ion source as claimed in claim 1,
further comprising an electrode,
said tubular section presenting a radially outwardly facing side surrounded by the electrode in the region between the coupling coil and the rear wall.

13. The ion source as claimed in claim 1,
further comprising a ferrite sleeve,
said coupling coil being surrounded by the ferrite sleeve on a side remote from the tubular section.

14. The ion source as claimed in claim 1,
further comprising a plurality of first magnets that each extend in the axial direction of the tubular section and are arranged parallel to one another around the circumference of the tubular section,
said coupling coil being surrounded by the plurality of first magnets,
said plurality of first magnets presenting dipole axes that are oriented perpendicular to the longitudinal axis of the tubular section, and
adjacent ones of said plurality of first magnets presenting a mutually opposite polarity.

15. The ion source as claimed in claim 1,
further comprising a plurality of second magnets that each extend in the axial direction of the tubular section and are arranged parallel to one another around the circumference of the tubular section,
said region of the tubular section between the coupling coil and the rear wall being surrounded by the plurality of second magnets,
said plurality of second magnets presenting dipole axes that are oriented perpendicular to the longitudinal axis of the tubular section, and
adjacent ones of said plurality of second magnets presenting a mutually opposite polarity.

16. The ion source as claimed in claim 15,
said plurality of second magnets disposed around the circumference of the tubular section adjacent the rear wall being smaller in number than the plurality of second magnets disposed around the circumference of the tubular section adjacent the coupling coil.

17. The ion source as claimed in claim 1,
further comprising an ignition source including a gas inlet,
said ignition source including a housing surrounding an ignition chamber and presenting an end face disposed opposite the rear wall,
said ignition chamber being connected to the combustion chamber via the inlet opening,
said end face including an ignition electrode with a hole therethrough,
said ignition electrode being covered relative to the combustion chamber by a covering plate, and
said ignition electrode being insulated from the rear wall.

18. The ion source as claimed in claim 17,
said gas inlet including an inlet valve with a controller,
said controller being configured to provide opening and closing of the inlet valve and/or a different through-flow through the inlet valve as a function of time.

19. The ion source as claimed in claim 1,
said closure plate including an inlet for gas that extends through the closure plate into the combustion chamber.

20. The ion source as claimed in claim 1,
further comprising an extractor disposed on a side of the closure plate remote from the combustion chamber,
said extractor including a passage opening oriented with respect to the outlet opening such that an acceleration voltage can be applied between the extractor and the closure plate,
a magnetic spectrometer disposed behind the extractor with respect to the closure plate,
an electron collector disposed adjacent the magnetic spectrometer, and
said electron collector configured such that an electrical voltage can be applied thereto.

21. The ion source as claimed in claim 1,
said closure plate being fixed along the outer circumference thereof to a fixing plate formed from an insulator material.

* * * * *